(12) United States Patent
Oughton, Jr. et al.

(10) Patent No.: US 9,398,723 B2
(45) Date of Patent: Jul. 19, 2016

(54) APPARATUS AND METHODS USING HEAT PIPES FOR LINKING ELECTRONIC ASSEMBLIES THAT UNEQUALLY PRODUCE HEAT

(71) Applicant: Eaton Corporation, Cleveland, OH (US)

(72) Inventors: George W. Oughton, Jr., Raleigh, NC (US); George Arthur Navarro, Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 144 days.

(21) Appl. No.: 14/013,456

(22) Filed: Aug. 29, 2013

(65) Prior Publication Data

US 2015/0062819 A1    Mar. 5, 2015

(51) Int. Cl.
*H05K 7/20* (2006.01)
*H01L 23/367* (2006.01)
*H01L 23/473* (2006.01)

(52) U.S. Cl.
CPC ........ *H05K 7/20336* (2013.01); *H01L 23/3672* (2013.01); *H01L 23/473* (2013.01); *H05K 7/209* (2013.01); *H05K 7/20518* (2013.01); *H01L 2924/0002* (2013.01)

(58) Field of Classification Search
CPC ............. H01L 23/473; H01L 23/3672; H05K 7/20336
USPC .......... 361/699, 700, 707, 715, 719; 363/141; 165/80.4; 257/723
See application file for complete search history.

(56) References Cited

U.S. PATENT DOCUMENTS 3,755,752 A   8/1973   Kim
4,535,384 A   8/1985   Wakabayashi et al.
(Continued)

FOREIGN PATENT DOCUMENTS

CN   201014739 Y   1/2008
EP   0047099 A2   3/1982
(Continued)

OTHER PUBLICATIONS

Weyant, J.; Garner, S.; Johnson, M.; Occhionero, M., "Heat pipe embedded AlSiC plates for high conductivity-low CTE heat spreaders," *Thermal and Thermomechanical Phenomena in Electronic Systems (I Therm ), 2010 12th IEEE Intersociety Conference on*, pp. 1,6, Jun. 2-5, 2010.

(Continued)

*Primary Examiner* — Anthony Haughton
*Assistant Examiner* — Matt Dhillon
(74) *Attorney, Agent, or Firm* — Myers Bigel & Sibley, P.A.

(57) ABSTRACT

An apparatus includes at least one heat sink and first and second electronic assemblies mounted on the at least one heat sink at respective first and second mounting sites and configured to unequally (e.g., at least partially non-concurrently) produce heat. At least one heat pipe is thermally coupled to the at least one heat sink and extends between locations proximate the first and second mounting sites. For example, the first and second electronic assemblies may be components of respective subsystems of an uninterruptible power supply (UPS), such as a rectifier and a battery converter, that generate heat in an at least partially non-concurrent manner.

21 Claims, 5 Drawing Sheets

(56) References Cited

U.S. PATENT DOCUMENTS

| | | | |
|---|---|---|---|
| 5,003,429 A | 3/1991 | Baker et al. | |
| 5,353,192 A | 10/1994 | Nordin | |
| 5,623,394 A | 4/1997 | Sherif et al. | |
| 6,050,332 A * | 4/2000 | Smith et al. | 165/185 |
| 6,493,227 B2 * | 12/2002 | Nielsen | H05K 7/20918 165/185 |
| 6,625,027 B2 | 9/2003 | Rider et al. | |
| 6,626,233 B1 * | 9/2003 | Connors | F28D 15/0233 165/104.33 |
| 6,661,661 B2 | 12/2003 | Gaynes et al. | |
| 6,666,260 B2 | 12/2003 | Tantoush | |
| 6,945,319 B1 * | 9/2005 | Li | F28D 15/0275 165/104.21 |
| 7,106,589 B2 * | 9/2006 | Kiley | F28D 15/0266 165/104.14 |
| 7,128,135 B2 | 10/2006 | Mok et al. | |
| 7,277,286 B2 * | 10/2007 | Lee | H05K 7/209 174/15.2 |
| 7,405,937 B1 | 7/2008 | Wang et al. | |
| 7,710,723 B2 * | 5/2010 | Korich | H05K 7/20927 165/104.33 |
| 7,796,389 B2 * | 9/2010 | Edmunds | H01L 23/427 165/104.14 |
| 7,939,968 B2 * | 5/2011 | Hjort | H02J 9/062 307/46 |
| 8,902,589 B2 * | 12/2014 | Gohara | H01L 23/3735 165/104.19 |
| 2002/0088609 A1 | 7/2002 | Tantoush | |
| 2002/0121811 A1 | 9/2002 | Hashimoto et al. | |
| 2003/0128518 A1 | 7/2003 | Gaynes et al. | |
| 2004/0031588 A1 | 2/2004 | Makaran | |
| 2004/0045702 A1 | 3/2004 | Barsun | |
| 2005/0241808 A1 | 11/2005 | Lee et al. | |
| 2006/0082945 A1 | 4/2006 | Walz | |
| 2006/0102324 A1 | 5/2006 | Mok et al. | |
| 2007/0114009 A1 | 5/2007 | Xia et al. | |
| 2008/0196870 A1 * | 8/2008 | Attlesey | G06F 1/20 165/104.33 |
| 2010/0277871 A1 | 11/2010 | Kitanaka et al. | |
| 2011/0108237 A1 * | 5/2011 | Kamath | H01L 23/4006 165/80.3 |
| 2011/0227415 A1 * | 9/2011 | Hjort | H02J 7/0047 307/66 |
| 2011/0292608 A1 | 12/2011 | Tan | |
| 2012/0026770 A1 | 2/2012 | West | |
| 2012/0098117 A1 | 4/2012 | Sato et al. | |
| 2012/0212051 A1 * | 8/2012 | Heidenreich | H02J 9/062 307/23 |
| 2012/0326653 A1 * | 12/2012 | Godrich | H02J 1/10 320/101 |
| 2012/0327609 A1 * | 12/2012 | Kitamoto | H01L 23/36 361/728 |
| 2013/0003305 A1 | 1/2013 | Stella | |
| 2013/0003309 A1 | 1/2013 | Stella | |
| 2013/0063027 A1 * | 3/2013 | Recker | H05B 33/0803 315/86 |
| 2013/0301223 A1 * | 11/2013 | Nelson | H05K 7/20681 361/716 |
| 2013/0340978 A1 * | 12/2013 | Agostini | H05K 7/20309 165/104.21 |
| 2014/0265845 A1 * | 9/2014 | Williams | H05B 37/0245 315/86 |
| 2015/0035467 A1 * | 2/2015 | MacLennan | H02M 1/12 318/503 |
| 2015/0146327 A1 * | 5/2015 | Pfitzer | H02H 3/093 361/18 |

FOREIGN PATENT DOCUMENTS

| | | |
|---|---|---|
| EP | 1 713 120 A2 | 10/2006 |
| GB | 1501388 A | 2/1978 |
| JP | S6063952 A | 4/1985 |
| JP | 2007317986 A | 12/2007 |

OTHER PUBLICATIONS

International Search Report and Written Opinion Corresponding to International Application No. PCT/US2014/051644; Date of Mailing: Nov. 17, 2014; 11 Pages.

International Preliminary Report on Patentability Corresponding to International Application No. PCT/US2014/051644; Date of Mailing: Mar. 10, 2016; 8 Pages.

* cited by examiner

APPARATUS AND METHODS USING HEAT PIPES FOR LINKING ELECTRONIC ASSEMBLIES THAT UNEQUALLY PRODUCE HEAT

BACKGROUND

The inventive subject matter relates to electronic systems and methods and, more particularly, to heat sink apparatus, systems using heat sinks and related methods Electronic systems frequently employ power electronic circuitry, such as power converters, that may generate significant amounts of heat. For example, uninterruptible power supply (UPS) systems typically include rectifiers, inverters, battery converters and other power electronic subsystems that may generate heat. Such heat may be dissipated by using heat sinks, which may be cooled using, for example, moving air or other fluids. In a typical UPS application, power transistors or other power semiconductor devices used in converter circuits may be packaged in modules that are configured to be mounted upon a surface of a heat sink, such that heat generated within the package may be transferred to the heat sink to cool the devices therein.

SUMMARY

Some embodiments of the inventive subject matter provide an apparatus including at least one heat sink and first and second electronic assemblies mounted on the at least one heat sink at respective first and second mounting sites and configured to unequally produce heat. For example, the, the first and second electronic assemblies may be components of respective subsystems of an uninterruptible power supply (UPS), such as a rectifier and battery converter, that generate heat in an at least partially complementary manner. The apparatus further includes at least one heat pipe thermally coupled to the at least one heat sink and extending between locations proximate the first and second mounting sites.

In some embodiments, the at least one heat sink may include separate first and second heat sinks. The first and second electronic assemblies may be mounted on respective ones of the first and second heat sinks. The at least one heat pipe may thermally couple the first and second heat sinks. The at least one heat pipe may include a plurality of parallel heat pipes. In some embodiments, the first and second heat sinks may each include a base having a side upon which the respective first and second electronic assemblies are mounted and a plurality of fins extending from a second side of the base. The first and second heat sinks may be positioned such that the fins thereof face one another, and the at least one heat pipe may pass between the bases of the first and second heat sinks.

In further embodiments, the at least one heat sink may include a single heat sink and the first and second electronic assemblies may be mounted at spaced apart locations on the single heat sink. The first and second electronic assemblies may be spaced apart along a direction and the at least one heat pipe may run along the same direction. The at least one heat pipe may include a plurality of parallel heat pipes.

In some embodiments, the at least one heat sink may include first and second base plates and a plurality of fins extending between the first and second base plates. The first and second electronic assemblies may be mounted on respective ones of the first and second base plates on sides thereof opposite the fins. The at least one heat pipe may thermally couple the first and second base plates.

In some embodiments, the first and second electronic assemblies may include respective components of first and second power converter circuit assemblies. The components may include, for example, respective first and second power semiconductor devices.

Further embodiments provide a UPS including at least two subsystems that are configured to generate heat in an unequal manner. The UPS also includes at least one heat sink having respective first and second components of respective ones of the at least two subsystems are mounted thereon at respective first and second mounting sites. The UPS further includes at least one heat pipe thermally coupled to the at least one heat sink and extending between locations proximate the first and second mounting sites. The at least two subsystems may include, for example, at least two of a rectifier circuit, an inverter circuit, a battery converter circuit and a bypass circuit. The first and second components may include respective first and second power semiconductor devices.

In some method embodiments of the inventive subject matter, first and second power semiconductor devices are mounted at respective first and second mounting sites of at least one heat sink. The at least one heat sink has at least one heat pipe thermally coupled thereto and extending between locations proximate the first and second mounting sites. The first and second power semiconductor devices are operated such that they unequally generate heat.

DETAILED DESCRIPTION

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Some embodiments of the inventive subject matter arise from an inventive realization that many electronics systems, such as UPSs, may include subsystems with power electronic circuitry that unequally generate heat, e.g., operate in at least a partially non-concurrent manner. For example, a typical double-conversion UPS may include rectifier, inverter, battery converter and a bypass subsystems that each include power electronic components (e.g., transistors and SCRs) that may generate significant heat when the subsystem is active. However, typical operations of these subsystems may involve modes in which certain ones of the subsystems are active while other subsystems are inactive and/or otherwise operating in a manner that generates substantially less heat. For example, in a UPS, the rectifier may be inactive when the UPS is using the battery converter to provide power to the inverter when the UPS is in an "on-battery" mode. Similarly, the inverter may be inactive when the bypass circuit is active. Providing individual cooling systems, e.g., individual separate heat sinks, for each of these subsystems may represent an inefficient use of space and materials, as these heat sinks may need to be sized to handle the peak heat output (e.g., peak power condition) of the subsystem. According to some embodiments of the inventive subject matter, "stranded" cooling capacity associated with inactive or less active subsystems may be recovered by using heat pipes to transfer heat from a site of a more active component to a site of an inactive or less active component, allowing the use of cooling resources, e.g., heat sink mass, cooling fin area, etc., associated with the inactive or less active component to be used to cool the more active component. This may allow for the use of more compact and less costly cooling systems.

Figure 1A:
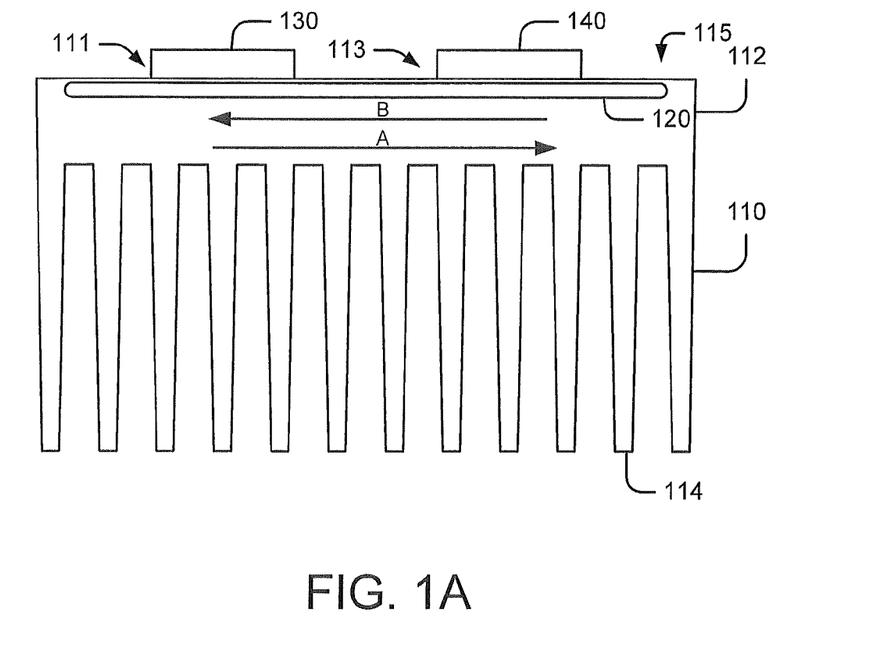
FIGS. 1A and 1B are side views illustrating an apparatus according to some embodiments using a single heat sink with heat pipes extending between mounting sites for electronic assemblies.
Figure 1B:
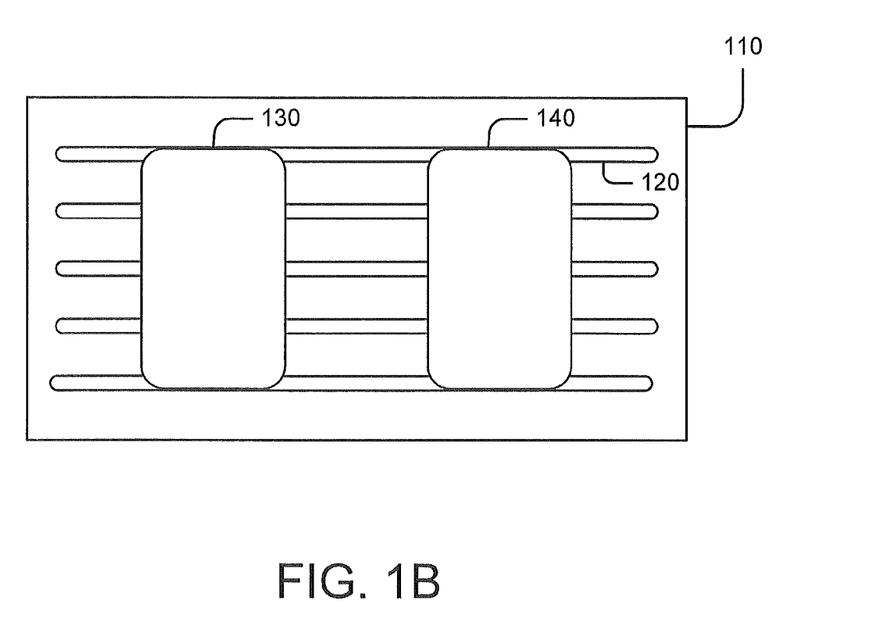

FIGS. 1A and 1B illustrate an apparatus according to some embodiments. The apparatus includes a heat sink 110, here shown as including a base portion 112 from which a plurality of fins 114 extend, First and second electronic assemblies 130, 140 are mounted at spaced apart first and second mounting sites 111, 113 on a surface 115 on a side of the base portion 112 opposite from the fins 114. The first and second electronic assemblies are configured to generate heat in an unequal manner such that, at a given time, one of the electronic assemblies 130, 140 is generating substantially more heat than the other. For example, the electronic assemblies 130, 140 may be power semiconductor components (e.g., transistors, SCRs and/or modules including multiples ones of such devices) of power converter circuits that operate in a complementary or non-concurrent manner. Heat pipes 120 are thermally coupled to the heat sink 110 (e.g., embedded in the heat sink 110) and extend between locations proximate the first and second mounting sites 111, 113, such that the heat pipes 120 may conduct heat between these locations in directions A or B, depending on which of the electronic assemblies 130, 140 is generating more heat.

As will be understood by those skilled in the art, a heat pipe is a heat-transfer structure that uses thermal conductivity and phase transition to provide heat transfer. A portion of the heat tube in contact with a hot surface absorbs heat from that surface and vaporizes a liquid in the tube. The vapor travels through the heat pipe to a lower temperature interface with another surface and condenses back into a liquid, which releases latent heat. The liquid recirculates to the hot interface via capillary action, gravity or other mechanism, producing a cycle that transfers heat between the hot and cold interfaces. A typical heat pipe comprises a sealed tube made of a thermally conductive material, such as copper or aluminum, which is filled with a coolant fluid under a partial vacuum. Various different coolants may be used and heat pipes may have various cross-sectional shapes, e.g., circular, oval, elliptical, planar, etc.

Figure 2:
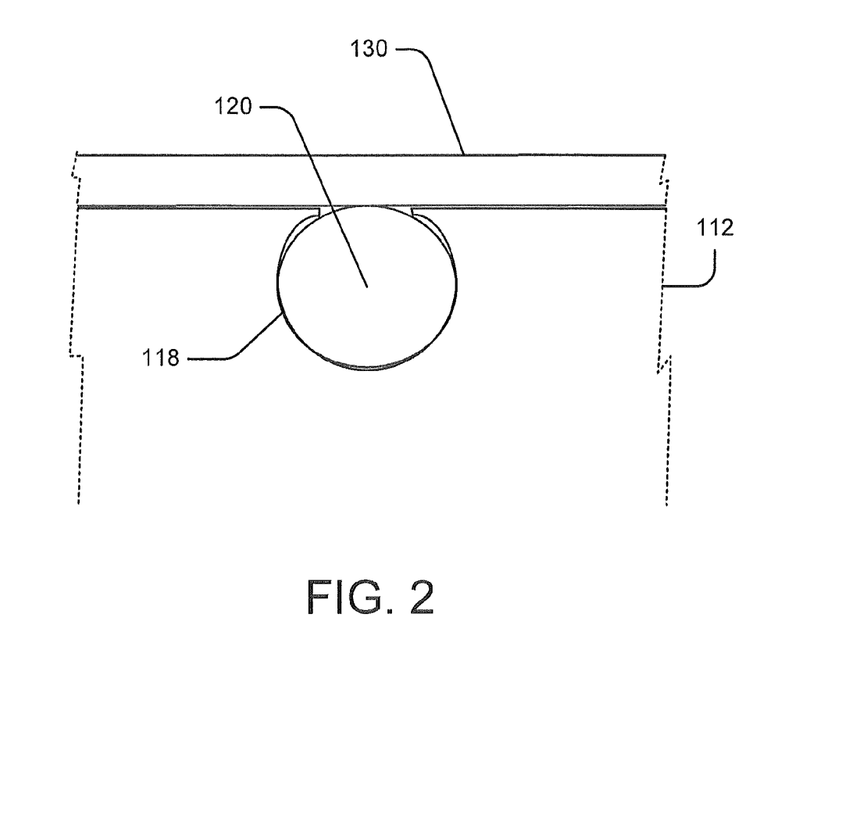
FIGS. 2 and 3 are cross-sectional views illustrating different heat pipe configurations according to some embodiments.
Figure 3:
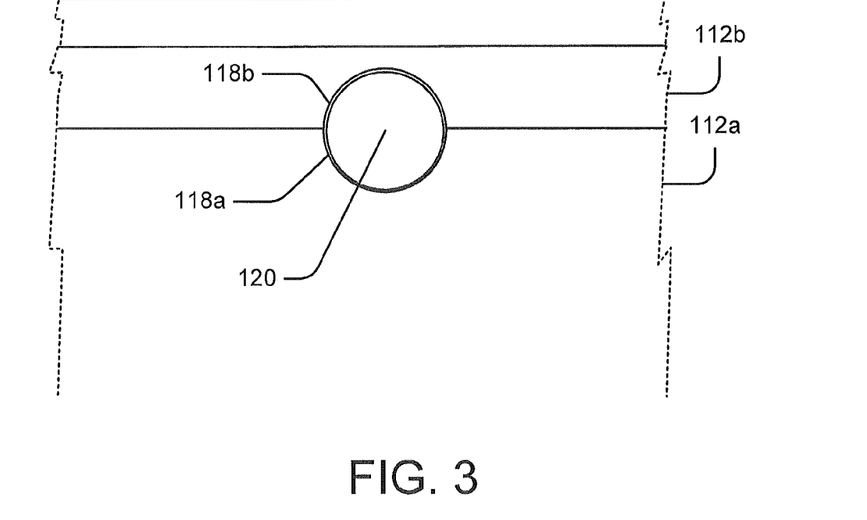

The heat pipes 120 may be thermally coupled to the heat sink 110 and/or the electronic assemblies 130, 140 in a number of different ways. For example, as shown in FIG. 2, a heat pipe 120 may be embedded in the base portion 112 of the heat sink 110 in a channel 118 that is positioned just below a mounting site for an electronic assembly 130. The channel 118 may be configured such that, for example, a heat transfer surface of the electronic assembly 130 may contact an upper portion of the heat pipe 120 to improve thermal conduction therebetween. Compression of the heat pipe 120 by the electronic assembly 130 may also force the heat pipe 120 against walls of the channel 118, thus improving thermal conduction to the base 112 of the heat sink 110. It will be appreciated that thermally conductive materials (e.g., thermal grease) may be interposed at junctions between the heat pipe 120 and the heat sink 110 and/or electronic assembly 130 to improve thermal conduction. FIG. 3 shows an alternative configuration in which a heat sink 110 has a two-part base comprising first and second portions 112a, 112b having respective channels 118a, 118b that are used to sandwich a heat pipe 120 therebetween. An electronic assembly 130 may be mounted on one base portion 112b.

Figure 4A:
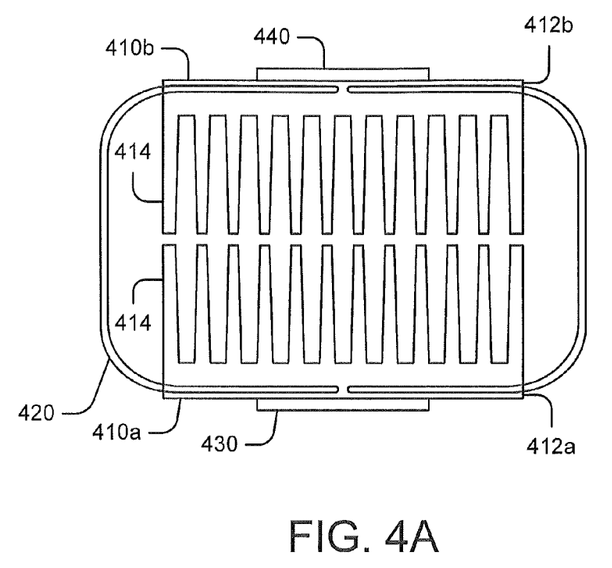
FIGS. 4A and 4b are side and perspective views, respectively, illustrating an apparatus according to some embodiments using two opposing heat sinks thermally coupled by heat pipes for electronic assemblies.
Figure 4B:
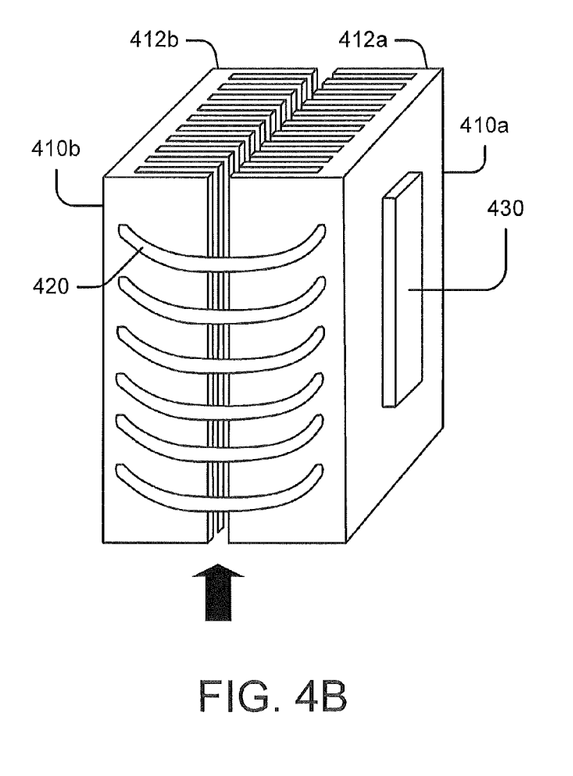
Figure 5:
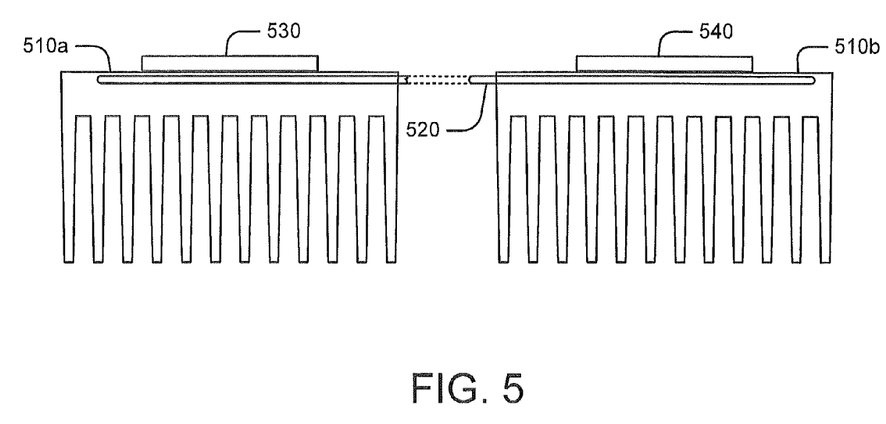
FIG. 5 is a side view illustrating an apparatus according to further embodiments using two heat sinks thermally coupled by heat pipes.

According to further embodiments, heat sink apparatus may utilize multiple heat sinks coupled by one or more heat pipes to similar effect. For example, FIGS. 4A and 4B illustrate an apparatus including first and second heat sinks 410a, 410b that are arranged such that their fins 414 face one another. First and second electronic assemblies 430, 440 that unequally (e.g., at least partially non-concurrently) generate heat are mounted on respective ones of the first and second heat sinks 410a, 410b. The heat sinks 410a, 410b are thermally coupled by heat pipes 420 that are disposed in and extend between base portions 412a, 412b of the heat sinks 410a, 410b. The heat pipes 420 facilitate transfer of heat between the heat sinks 410a, 410b depending on which of the assemblies 430, 440 is generating a greater amount of heat. The arrangement of the heat sinks 410a, 410b allows a single airflow (e.g., from a single fan or group of fans) to be used to dissipate heat emanating from the heat sinks 410a, 410b. As shown in FIG. 5, however, multiple heat sinks 510a, 510b with a different physical arrangement that shown in FIGS. 4A and 4B may be thermally coupled by one or more heat pipes 520 to achieve similar effects.

Figure 6:
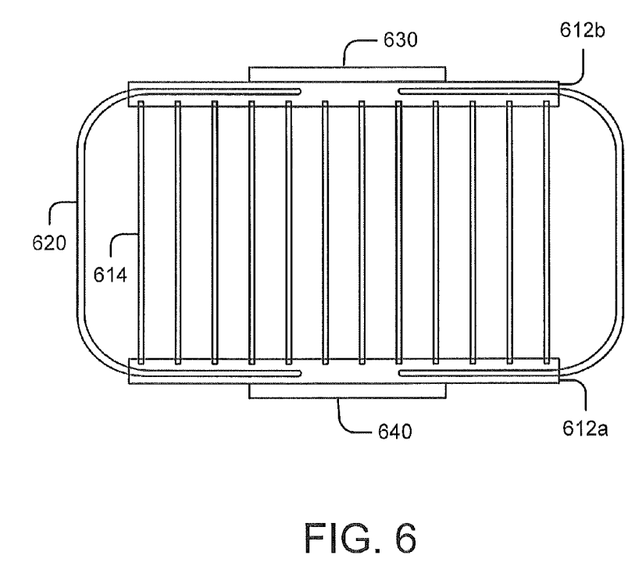
FIG. 6 is a side view illustrating an apparatus according to further embodiments using a heat sink with first and second base sections attached to common fins and linked by heat pipes.

FIG. 6 illustrates another heat sink configuration including first and second heat sink base plates 612a, 612b, upon which are mounted first and second electronic assemblies 630, 640.

The base plates 612a, 612b are joined by a plurality of fins 614 running therebetween. The fins 614 may be, for example, sheet metal plates that are press-fit, welded, glued or otherwise attached to the base plates 612a, 612b. Heat pipes 620 thermally couple the base plates 612a, 612b and facilitate heat transfer between the bases 612a, 612b depending on which of the assemblies 630, 640 is generating a greater amount of heat. The heat pipes 620 may be embedded in the base plates 612a, 612b in a manner similar to that shown in FIG. 2 or 3, and the heat pipes 620 may comprise parallel heat pipes arranged in a manner similar to that shown in FIG. 4B.

Figure 7A:
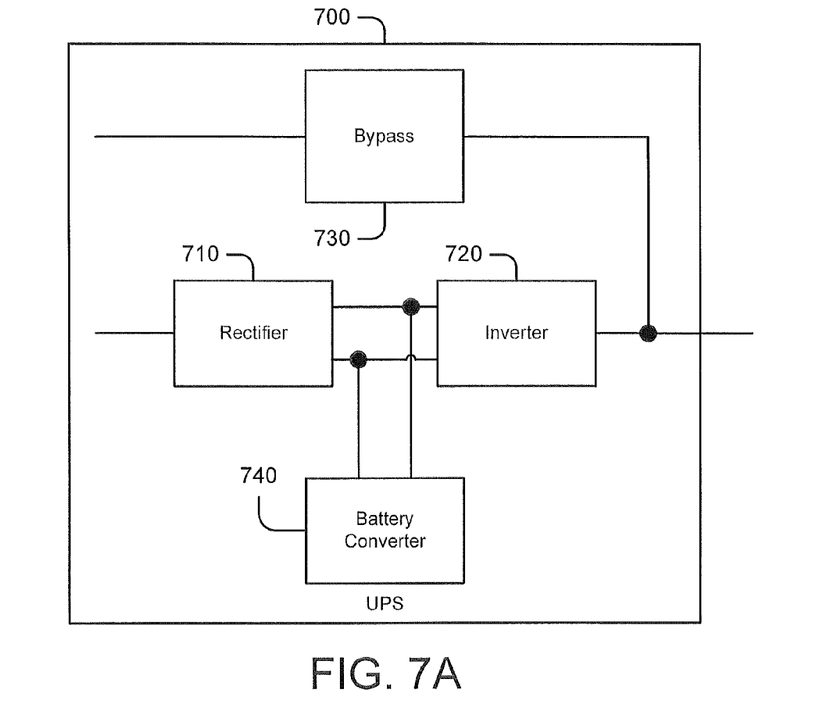
FIGS. 7A and 7B are schematic diagrams illustrating an uninterruptible power supply system according to further embodiments.
Figure 7B:
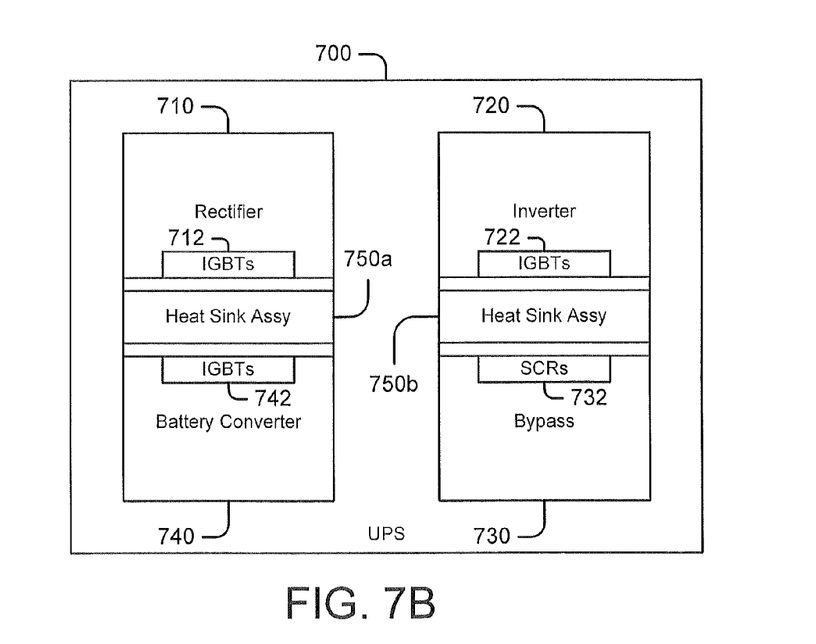

FIGS. 7A and 7B illustrate an advantageous use of apparatus along the lines discussed above in a UPS application. As shown in FIG. 7A, a double conversion UPS 700 may include multiple subsystems, such as a rectifier circuit 710, an inverter circuit 720, a bypass circuit 730 and a battery converter circuit 740. The rectifier circuit 710 is configured to receive power from an AC source, such as a utility line. The rectifier circuit 710 may be coupled to the inverter circuit 720 by a DC bus, and the inverter circuit 720 may be configured to generate an AC output at a load from the DC input provided by the intermediate DC bus. The battery converter circuit 740 may also be coupled to the DC bus and may be used to transfer power from a battery (not shown) to the inverter circuit 720 when the AC utility source fails, and may charge the battery from the DC bus at other times. The bypass circuit 730 may be used to bypass the rectifier circuit 710 and the inverter circuit 720 and directly power the load from the AC utility source. The bypass circuit 730 may be used, for example, in the event of a failure of the rectifier circuit 710 and/or the inverter circuit 720, for maintenance of these circuits and/or to support certain operational modes, such as "eco" modes in which the bypass circuit 730 is used to deliver power to the load when the AC utility source meets certain power quality criteria.

The subsystems of the UPS shown in FIG. 7A generally do not all simultaneously generate large amounts of heat because these subsystems are generally not all operating at the same power level at the same time. For example, when the UPS 700 is running in an "on-line" mode in which power is transferred from the AC utility source through the rectifier circuit 710 and the inverter circuit 720, the rectifier circuit 710 and the inverter circuit 720 may be generating significant amounts of heat, while the bypass circuit 730 may be inactive and the battery converter circuit 740 may be inactive and/or running at a greatly diminished duty (e.g., the battery converter circuit 740 may be charging the attached battery at a much lower current level than when powering a load), such that these units generate significantly less heat. Similarly, when the UPS 700 is operating "on battery", the inverter circuit 720 and the battery converter circuit 740 may be generating significant amounts of heat, while the rectifier circuit 510 and the bypass circuit 530 may be inactive and generating little or no heat. The bypass circuit 730 may generate a significant amount of heat when the UPS 700 is operating in bypass mode in which current is passing from the source to the load via the bypass circuit 730, while the inverter circuit 720 may be inactive or may be operating at power levels (e.g., for power conditioning) that generate significantly less heat.

The relationships among the operations of the subsystems of the UPS 700 in these various operational modes may allow the use of shared heat sink assemblies along the lines described above, e.g., heat generating components that operate in an unequal (e.g., complementary or at least partially non-concurrent) manner may utilize a heat sink assembly as described above. For example, as shown in FIG. 7B, the rectifier circuit 710 and the battery converter circuit 740 may use a first heat sink assembly 750a, and the inverter circuit 720 and the bypass circuit 730 may share a second heat sink assembly 750b, where the first and second heat sink assemblies 750a, 750b each have, for example, a structure such as those illustrated in FIGS. 1A and 1B, 4A and 4B, 5 and 6. In particular, power transistors, e.g., IGBTs 712, of the rectifier circuit 710 and IGBTs 742 of the battery converter circuit 742 may be mounted on the first heat sink assembly 750a in a manner similar to that described with reference to FIGS. 1A and 1B or 4A and 4B. IGBTs 722 of the inverter circuit 720 and SCRs 732 of the bypass circuit 730 may be mounted on the second heat sink assembly 750b in a similar manner.

it will be appreciated that the configurations illustrated are provided for purposes of illustration, and that other configurations may be used in some embodiments. For example, in some embodiments, a single heat pipe may be used instead of the multiple parallel heat pipes should in FIGS. 1A-B and 4A-B. Heat pipes may have circular cross sections as shown in some of the illustrated embodiments and/or may have other cross-sectional shapes, such as oval or elliptical. Although FIGS. 1A-b and 3A-B illustrate the use of a heat sinks with fins, other types of heat sinks may be used, such as heat sinks that take other forms (e.g., plates) and/or heat sinks that use circulating liquid, thermoelectric, or other cooling structures rather than, or in addition to, fins. Heat sink apparatus according to further embodiments may be used in electronic systems other than UPS, such as in solar and wind power generation systems or power supply units (e.g., redundant source power supplies) for computers or other electronic equipment.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. An apparatus comprising:
   at least one heat sink;
   first and second electronic assemblies mounted on the at least one heat sink at respective first and second mounting sites, wherein the first and second electronic assemblies are components of respective subsystems of a UPS; and
   at least one heat pipe thermally coupled to the at least one heat sink, each of the at least one heat pipe having first and second portions disposed proximate respective ones of the first and second mounting sites, wherein the first and second electronic assemblies are configured to generate heat in an at least partially non-concurrent manner such that heat is transferred between the first and second mounting sites through the at least one heat pipe in different directions at different times.

2. The apparatus of claim 1,
   wherein the at least one heat sink comprises separate first and second heat sinks;
   wherein the first and second electronic assemblies are mounted on respective ones of the first and second heat sinks; and
   wherein the at least one heat pipe thermally couples the first and second heat sinks.

3. The apparatus of claim 2, wherein the at least one heat pipe comprises a plurality of parallel heat pipes.

4. The apparatus of claim 2, wherein the first and second heat sinks each comprise a base having a side upon which the respective first and second electronic assemblies are mounted and a plurality of fins extending from a second side of the base, wherein the first and second heat sinks are positioned such that the fins thereof face one another, and wherein the at least one heat pipe passes between the bases of the first and second heat sinks.

5. The apparatus of claim 1,
wherein the at least one heat sink comprises first and second base plates and a plurality of fins extending between the first and second base plates;
wherein the first and second electronic assemblies are mounted on respective ones of the first and second base plates on sides thereof opposite the fins; and
wherein the at least one heat pipe thermally couples the first and second base plates.

6. The apparatus of claim 1, wherein the at least one heat sink comprises a single heat sink and wherein the first and second electronic assemblies are mounted at spaced apart locations on the single heat sink.

7. The apparatus of claim 6, wherein the first and second electronic assemblies are spaced apart along a direction and wherein the at least one heat pipe runs along the same direction.

8. The apparatus of claim 7, wherein the at least one heat pipe comprises a plurality of parallel heat pipes.

9. The apparatus of claim 1, wherein the first and second electronic assemblies comprise respective components of first and second power converter circuit assemblies.

10. The apparatus of claim 9, wherein the components comprise respective first and second power semiconductor devices.

11. An uninterruptible power supply (UPS) comprising:
a plurality of UPS subsystems comprising at least two of a rectifier circuit, an inverter circuit, a battery converter circuit and a bypass circuit;
at least one heat sink having respective first and second components of respective ones of first and second subsystems of the plurality of UPS subsystems, the first and second components mounted on the at least one heat sink at respective first and second mounting sites; and
at least one heat pipe thermally coupled to the at least one heat sink, each of the at least one heat pipe having first and second portions disposed proximate respective ones of the first and second mounting sites, wherein the first and second components pipe generate heat in an at least partially non-concurrent manner such that heat is transferred between the first and second mounting sites through the at least one heat pipe in different directions at different times.

12. The UPS of claim 11, wherein the first and second components comprise respective first and second power semiconductor devices.

13. The UPS of claim 11,
wherein the at least one heat sink comprises separate heat sink bases;
wherein the first and second power semiconductor devices are mounted on respective ones of the heat bases; and
wherein the at least one heat pipe thermally couples the first and second heat sink bases.

14. The UPS of claim 11, wherein the at least one heat sink comprises a single heat sink and wherein the first and second power semiconductor devices are mounted at spaced apart locations on the single heat sink.

15. The UPS of claim 14, wherein the first and second power semiconductor devices are spaced apart along a direction and wherein the at least one heat pipe runs along the same direction.

16. The UPS of claim 11, wherein the first and second components comprise a component of the rectifier circuit and a component of the battery converter circuit, respectively.

17. The UPS of claim 11, wherein the first and second components comprise a component of the inverter circuit and a component of the bypass circuit, respectively.

18. A method comprising:
mounting first and second power semiconductor devices at respective first and second mounting sites of at least one heat sink having at least one heat pipe thermally coupled thereto, each of the at least one heat pipe having first and second portions disposed proximate respective ones of the first and second mounting sites, wherein the first and second power semiconductor devices are components of respective subsystems of a UPS; and
operating the first and second power semiconductor devices such that they generate heat in an at least partially non-concurrent manner to cause heat to be transferred between the first and second mounting sites through the at least one heat pipe in different directions at different times.

19. The method of claim 18, wherein the at least one heat sink comprises separate first and second heat sinks, wherein the at least one heat pipe thermally couples the first and second heat sinks and wherein mounting the first and second power semiconductor devices comprises mounting the first and second power semiconductor devices on respective ones of the first and second heat sinks.

20. The method of claim 18, wherein the at least one heat sink comprises first and second base plates and a plurality of fins extending between the first and second base plates, wherein the at least one heat pipe thermally couples the first and second base plates, and wherein mounting the first and second power semiconductor devices comprises mounting the first and second electronic assemblies are mounted on respective ones of the first and second base plates on sides thereof opposite the fins.

21. The method of claim 18, wherein the at least one heat sink comprises a single heat sink and wherein mounting the first and second power semiconductor devices comprises mounting the first and second power semiconductor devices at spaced apart locations on the single heat sink.

* * * * *